United States Patent [19]

Hatakenaka et al.

[11] 4,301,958
[45] Nov. 24, 1981

[54] ARRANGEMENT FOR AUTOMATICALLY FABRICATING AND BONDING SEMICONDUCTOR DEVICES

[75] Inventors: Tatsuo Hatakenaka, Yokohama; Kiyouhei Tamaki, Tama; Tetsuo Nanbu, Tokyo, all of Japan

[73] Assignee: Fujitsu Limited, Kawasaki, Japan

[21] Appl. No.: 69,286

[22] Filed: Aug. 24, 1979

[30] Foreign Application Priority Data

Aug. 24, 1978 [JP] Japan .......................... 53-115108[U]
Aug. 25, 1978 [JP] Japan ................................. 53-102814

[51] Int. Cl.³ ........................................... H01L 21/58
[52] U.S. Cl. .................................... 228/4.5; 29/430; 198/341; 198/358; 198/369; 228/6 A; 228/47
[58] Field of Search .................... 228/4.5, 6 A, 47; 29/430; 198/339, 341, 358, 369

[56] References Cited

U.S. PATENT DOCUMENTS

| | | | |
|---|---|---|---|
| 3,444,612 | 5/1969 | Pennings | 228/4.5 X |
| 3,522,942 | 8/1970 | Hepp | 198/339 X |
| 4,027,246 | 5/1977 | Caccoma et al. | 29/430 X |
| 4,030,622 | 6/1977 | Brooks et al. | 198/339 X |
| 4,054,238 | 10/1977 | Lloyd et al. | 228/6 A X |
| 4,144,960 | 3/1979 | Schourtes | 198/339 |

OTHER PUBLICATIONS

Herring, Sattler and Monahan *Western Electric Technical Digest* No. 36 Oct. 1974, pp. 17-18.

*Primary Examiner*—Gil Weidenfeld
*Assistant Examiner*—K. J. Ramsey
*Attorney, Agent, or Firm*—Staas & Halsey

[57] ABSTRACT

A system for automatically fabricating and bonding semiconductor devices using lead frames and semiconductor chips, which comprises means for supplying a continuous strip of lead frames, an automatic die bonder for mounting semiconductor chips on the lead frames and forming sheets thereof, buffer means for temporarily storing the sheets formed of the lead frames and semiconductor chips mounted thereon, and at least one automatic wire bonder, all of these apparatuses being arranged in a line. The sheets are automatically and successively fed from the automatic die bonder to the buffer means and from the buffer means to the automatic wire bonder by means of a series of automatic conveyor mechanisms.

17 Claims, 12 Drawing Figures

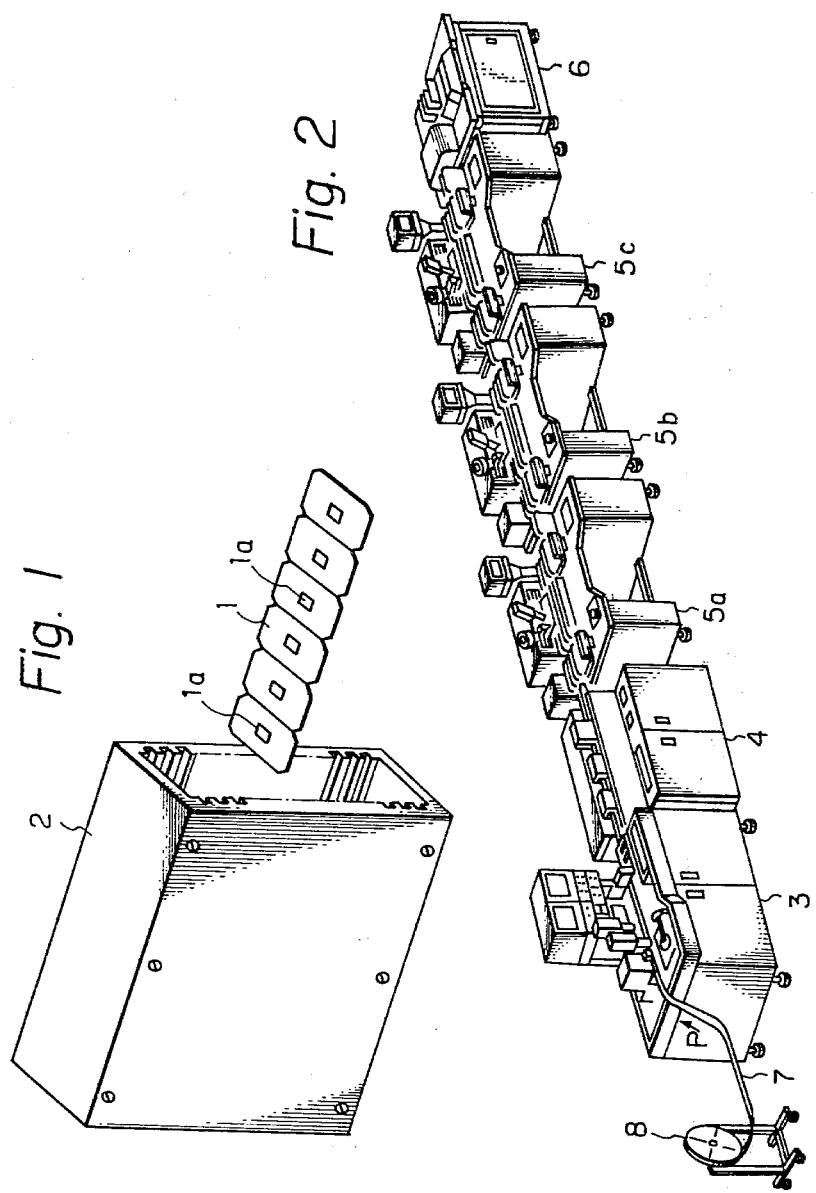

ARRANGEMENT FOR AUTOMATICALLY FABRICATING AND BONDING SEMICONDUCTOR DEVICES

FIELD OF THE INVENTION

This invention relates to a system for automatically fabricating and bonding semiconductor devices, such as an integrated circuit (IC) or a large scale integrated circuit (LSI), and more particularly one which also automatically encases the completed semiconductor devices into a container magazine.

BACKGROUND OF THE INVENTION

Conventionally, fabrication of semiconductor devices, such as the IC or LSI, is attained by performing a series of steps comprising a bonding step for bonding semiconductor chips to substrates, called lead frames, for mounting the semiconductor chips thereon, a wire bonding step for effecting wiring between the lead frames and the semiconductor chips mounted thereon, and a packaging step for packaging the assemblies using plastic moldings or ceramic packages. In these steps, there are employed a die bonder, a wire bonder and a packaging apparatus, respectively. In the aforesaid fabrication process, the substrates for semiconductor parts, i.e., lead frames, or half-completed semiconductor devices wherein semiconductor chips are mounted on the lead frames, are encased in a box-form jig, generally called a magazine, in such a form that a plurality of lead frames are connected to each other. The magazines are used for supplying to, taking out from or transporting the parts between the respective steps. The fabrication steps are automated by introducing an automatic pattern recognition technique into the die bonder or the wire bonder so that almost all of the process steps can be done without manual intervention except for the supplying or taking out of the materials, such as semiconductor chips, lead frames, wiring materials, etc., and transporting them between the process steps. In other words, an operator attending to the fabrication process is used mainly for handling the aforesaid materials and watching the operation of the apparatuses, and not to take part in the fabricating operations of the apparatuses. In the fabrication process of semiconductor devices, it is desired to automate and integrate the handling of the materials with the other process steps, thus improving fabrication efficiency and reducing fabrication costs by eliminating manual labor.

SUMMARY OF THE INVENTION

It is therefore an object of the present invention to provide a novel system for automatically fabricating and bonding semiconductor devices which is capable of satisfying the aforesaid requirements.

Another object of the invention is to provide a system for automatically fabricating and bonding semiconductor devices which is capable of producing finished semiconductor devices at a constant rate and ensuring constant fabrication efficiency, irrespective of any variation in the raw material or sub-assembly feeding rates or changes in the type of desired finished semiconductor devices.

Still another object of the invention is to provide automation in the process operation, especially that in the wire bonding apparatus, employed in the different steps for fabricating the semiconductor devices.

The above and other objects and features of the present invention will become more apparent from the ensuing description of the preferred embodiments with reference to the accompanying drawings.

BRIEF DESCRIPTION OF THE DRAWINGS

FIG. 1 is a perspective view of a plurality of lead frames connected in series and a conventional carrying box-form magazine for the lead frames;

FIG. 2 is a general perspective view of one embodiment of the system for automatically fabricating and bonding semiconductor devices in accordance with the present invention;

DESCRIPTION OF THE PREFERRED EMBODIMENTS

Figure 3:
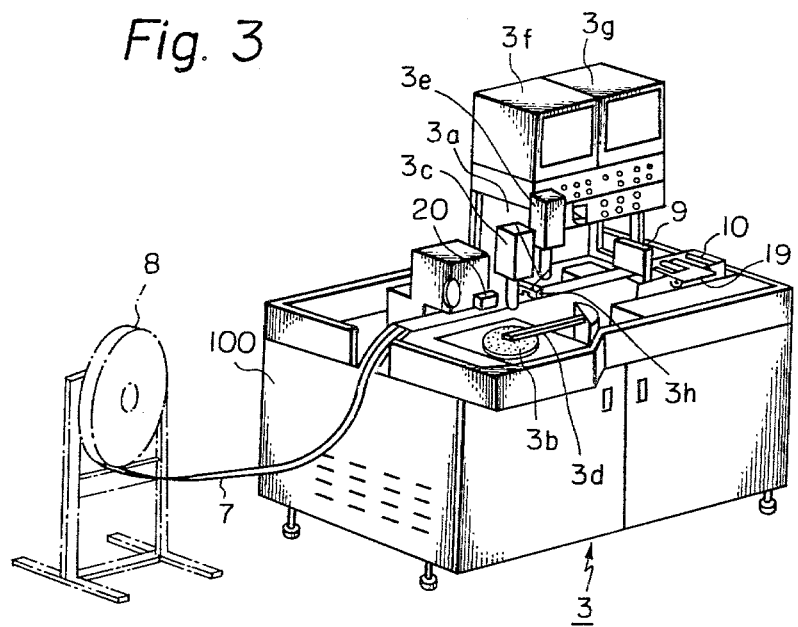
FIG. 3 is a perspective view of an automatic die bonder employable in the present invention.

Referring now to FIG. 1, there is shown a continuous sheet of lead frames with the reference numeral 1 generally designating the lead frames and the reference numeral 1a designating the semiconductor chips mounted on the lead frames. Reference numeral 2 designates a conventional box-form magazine having a number of racks formed therein for encasing a plurality of sheets of lead frames.

FIG. 2 illustrates one embodiment of an automatic system for fabricating and bonding semiconductor devices in accordance with the present invention. In the figure, reference numeral 3 identifies an automatic die bonder, numeral 4 buffer means, 5-a, 5-b, 5-c automatic wire bonders and 6 a magazine conveyor and encasing mechanism. Although three automatic wire bonders of the same type are employed in the embodiment as illustrated, the number of the automatic wire bonders may be changed and the type suitably selected depending upon the operational requirements of the automatic die bonder and the automatic wire bonders. Numeral 7 designates a series of lead frames preliminarily formed as a continuous strip of material and wound around a reel 8. The continuous band 7 of successive lead frames is fed to the automatic die bonder 3 in the direction of an arrow P. To initiate the feeding of the band 7 of the lead frames to the automatic die bonder 3, an operator may manually put the forward end of the band 7 of the lead frames into the automatic die bonder 3.

The structure and operation of each of the aforesaid apparatuses of the automated system will now be explained.

FIG. 3 illustrates in greater detail the automatic die bonder 3. The automatic die bonder 3 is comprised of a bonding mechanism section 3a for mounting chips on respective lead frames, a cutting mechanism section 9 for cutting the continuous band 7 of lead frames into lengths of a predetermined number of lead frames after completion of the chip mounting, a transport mechanism section 10 for feeding the lead frames cut in the predetermined length (hereinafter referred to as "sheet") to a succeeding apparatus, a thickness detector 20 as will be further described later and a control box 100 containing therein controllers of the above-noted respective sections. The bonding mechanism section 3a has a known structure which is adapted for bonding a semiconductor chip automatically fed from a chip supplying section onto each of the lead frames. The bonding of the semiconductor chip onto each lead frame is attained by employing, for example, a conventional ultrasonic bonding method in which a gold foil or paste applied between the lead frame and a semiconductor chip to be fixed to said lead frame is ultrasonically melted, and the melted gold or paste connects the semiconductor to the lead frame. The above-mentioned chip supplying section is comprised of a plate 3b on which semiconductor chips are spread out, an image sensor 3c for controlling the position of the semiconductor chips, a transfer arm 3d for transferring the semiconductor chips from the plate 3b toward the bonding mechanism section 3a, and a display device 3f connected to the image sensor 3c. The bonding mechanism section 3a further includes an image sensor 3e for controlling the bonding position of the lead frames, a bonding head 3h, and a display device 3g connected to the image sensor 3e.

Figure 4:
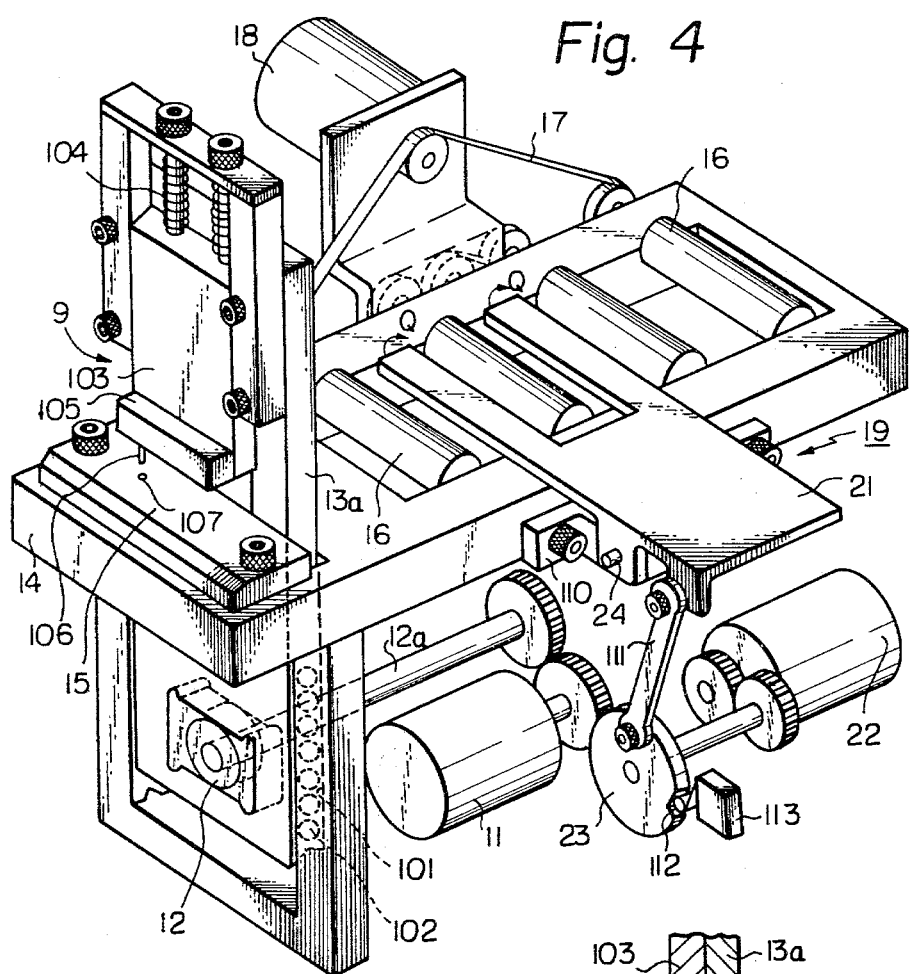
FIG. 4 is an enlarged perspective view illustrating the structures and cooperation of a cutting mechanism, transport mechanism and expelling mechanism of the automatic die bonder illustrated in FIG. 3.
Figure 4A:
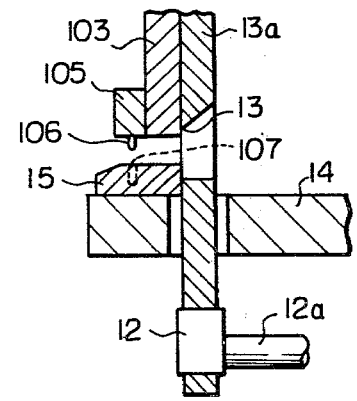
FIG. 4A is a partial cross-sectional view of the cutting mechanism illustrated in FIG. 4.

FIGS. 4 and 4A illustrate the cutting mechanism section 9 and the transport mechanism section 10 of the die bonder. The cutting mechanism section 9 comprises a cutting edge 13 adapted to move up and down by means of a motor 11 rotatably driving a cam shaft 12a, an eccentric cam 12 fixed to the cam shaft 12a for movement therewith, and a support plate 13a for the cutting edge 13 engaging the cam 12. The section 9 further comprises a stationary cutting edge 15 fixed to a frame 14 to cooperate with the movable cutting edge 13 for the purpose of cutting the continuous lead frames into a predetermined length. The support plate 13a of the cutting edge 13 is guided by a guide groove 101 containing therein a plurality of ball bearings 102. A plate 103 is used as a pressure plate for applying a pressure, exerted by a spring 104, to the lead frames when the cutting operation is carried out. The plate 103 is provided with a support 105 to which a positioning pin 106 capable of entering into a positioning hole 107 of the stationary cutting edge 15 is attached. The transport mechanism section 10 is provided with a plurality of rollers 16 supported by the frame 14 and driven by a motor 18 through a belt 17 for feeding the sheet to the succeeding buffer means 4 (FIG. 2).

Where the continuous strip 7 of the lead frames has seams by welding or caulking, a thickness detector 20 and an expelling mechanism section 19 as illustrated in FIGS. 3 and 4 are employed in the die bonder for detecting the seamed portions and expelling sheets containing the seams, respectively.

The expelling mechanism section 19 comprises a fork-shape expelling plate 21 pivotally rotated at one end about a shaft 24 which is attached to a boss member 110 mounted on the frame 14, and a crank arm 111 having one end pivotally connected to an outermost end of the expelling plate 21 and the other end pivotally connected to a crank disc 23. Disc 23 is in turn rotated by a drive motor 22. The expelling plate 21 is pivoted in the direction of arrows Q about the shaft 24 when the crank disc 23 is rotated by the drive motor 22, whereby the sheets containing seams are expelled by the plate 21 from the rollers 16. The crank disc 23 is formed with a notch 112 which is capable of cooperating with a micro-switch 113. The micro-switch 113 is provided for stopping the operation of the drive motor 22 when the expelling plate 21 returns to its horizontal position shown in FIG. 4.

To allow for detection of seams in the strip, and as best shown in FIG. 3, the thickness detector 20 shown in FIG. 3 is arranged in the stage preceding the bonding mechanism section 3a and, the cutting mechanism section 9 and the expelling mechanism section 19 are arranged in operational positions succeeding the bonding mechanism section 3a. Thus, when one of the seams of the continuous strip 7 of lead frames is detected by the thickness detector 20, a detecting signal is issued from the detector 20 to all of the three sections 3a, 9, and 19. As a result of this signal the bonding mechanism section 3a does not activate to bond a semiconductor chip to the lead frame containing the detected seam when said lead frame passes through the section 3a. On the other hand, when the lead frame containing the detected seam passes through the cutting mechanism section 9, said lead frame is cut out of the continuous band 7 of the lead frames by section 9, and the cut lead frame containing the seam is expelled from the transport section 10 by the operation of the expelling mechanism section 19.

Figure 5:
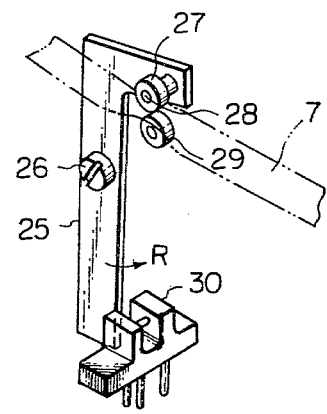
FIG. 5 is a perspective view of a thickness detector provided in the automatic die bonder illustrated in FIG. 3.

FIG. 5 exemplarily illustrates a specific structure of the thickness detector 20 for detecting a seam contained in the continuous strip 7 of lead frames. An inverted L-shaped lever 25 is rotatably supported by a rod-shaped screw 26 and a roller 27 is rotatably mounted on one end of the lever 25 by means of a pin 28 and is arranged adjacent to a fixed roller 29 provided on the frame of the automatic die bonder 3 of FIG. 3. If the lead frames containing a seam pass between the rollers 27 and 29, the roller 27 is caused to move upwardly due to the increased thickness of the seamed portion, thereby rotating the lever 25 in the direction of an arrow R. When lever 25 rotates, it shuts off a beam of light from a photosensor 30 provided in the vicinity of the lever 25 to generate an electric signal indicating the detection of a seamed portion passing therethrough. This signal is stored in an electronic control device so as to deactivate bonding section 3a (FIG. 3), to activate cutting section 9 (FIGS. 3 and 4), and to operate the expelling mechanism section 19 (FIGS. 3 and 4) when the sheet containing the seam comes to the expelling plate 21 of the section 19. It should be noted however that if the continuous strip 7 of lead frames contains no thickened seam or seams, no thickness detector 20 need be arranged or used in the automatic die bonder 3 of FIG. 3.

Figure 6:
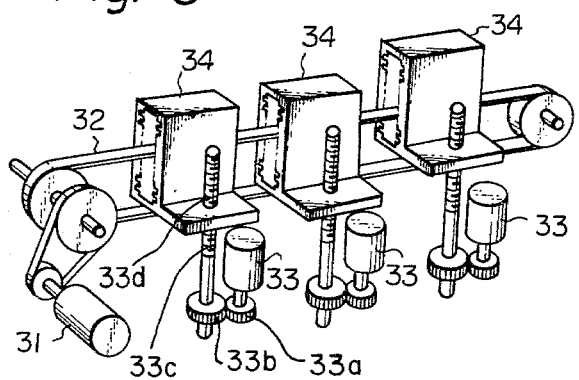
FIG. 6 is a perspective view of a transport mechanism, storing mechanism, and operating mechanism of buffer means of the system illustrated in FIG. 2.

Referring again to FIG. 2, the buffer means 4 is provided for temporarily holding sheets coming from the automatic die bonder 3. In doing so, buffer means establishes an operative coupling between the die bonder 3 and one or more automatic wire bonders 5a, 5b and 5c, which have, respectively, an operating speed different from that of the die bonder 3, without lowering the operating efficiencies of the respective bonders. Buffer means 4 also minimizes down time of the automatic die bonder 3 due to a change to different types of semiconductor chips. To achieve these functions, the buffer means 4 comprises as illustrated in FIG. 6 a conveyor mechanism section including a drive motor 31, and a conveyor belt 32 driven by the motor 31 and a storing mechanism section including a plurality of large capacity buffer magazines 34 movable up and down. To move each of the magazines 34, an operating mechanism is provided which includes a motor 33, gears 33a and 33b driven by the motor, a feed screw 33c connected at one end to the gears, and engaged in a threaded hole 33d formed on a portion of the magazine 34. When one of the motors 33 is activated, the driven feed screw moves the corresponding magazines 34 up or down. Thus, when any of the wire bonders is not in a position to receive sheets fed from the die bonder 3 (each sheet having a predetermined number of lead frames with semiconductor chips mounted thereon respectively), the sheets are successively stored in the magazines 34. On the other hand, when the sheet supply from the die bonders, is not adequate for satisfying the supply demand required by the wire bonder, then the sheets stored in the magazines 34 are supplied to the wire bonders.

The automatic wire bonders 5a, 5b and 5c shown in FIG. 2 effect wiring of electrodes of the chip bonded to each lead frame to the lead end of the lead frame using a thin wire of gold or aluminum. In this connection, it is noted that since the operating speed of each of the automatic wire bonders 5a, 5b, and 5c is much slower than that of the automatic die bonder 3, a plurality of wire bonders are employed normally for one die bonder. Therefore, each of the wire bonders has two functions, namely, a function to effect the wire bonding operation and a function of either to feed sheets to another wire bonder or to transport sheets after wire bonding to the succeeding operating stage of the system.

Figure 7:
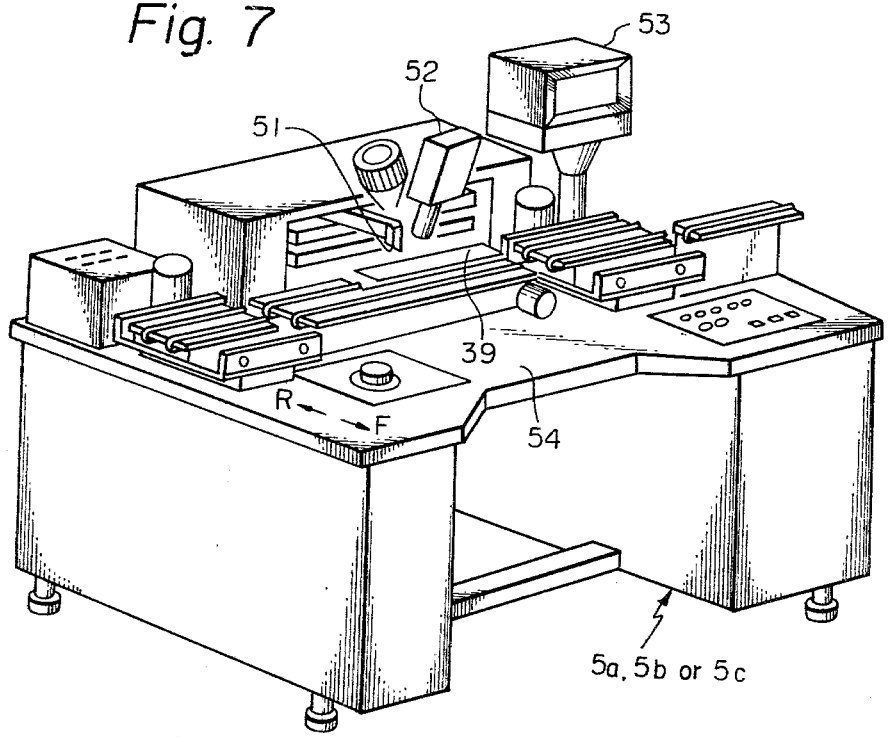
FIG. 7 is a perspective view of an automatic wire bonder of the system illustrated in FIG. 2.

The specific structure of an automatic wire bonder employed in the present invention will now be explained with reference to the illustration of FIG. 7. In FIG. 7, reference numeral 51 identifies a bonding head member for effecting wiring using gold or aluminum thin wires between the electrodes of the semiconductor chips on the sheet fed from the buffer means 4 and the lead end of the lead frames on which the chips are mounted respectively. The electrodes and the lead are bonded using the thin wires, for example by an ultrasonic bonding method. Reference numeral 52 identifies an image sensor for positioning the semiconductor chip and the lead frame relative to the bonding head 51 prior to the bonding thereby. Reference numeral 53 identifies a display device connected to the image sensor 52. Reference numeral 54 identifies a table top of the automatic wire bonder on which conveyor devices, as will now be described are mounted.

Figure 8:
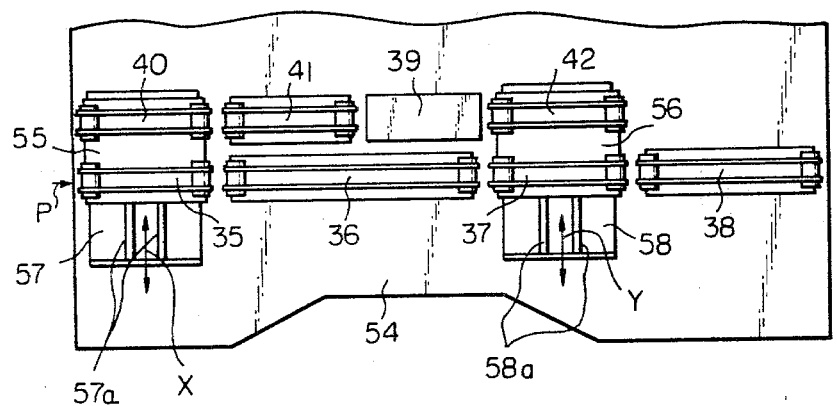
FIG. 8 is a plan view illustrating a conveyor mechanism arrangement provided on the table top of the automatic wire bonder illustrated in FIG. 7.

The arrangement of the conveyor devices are illustrated in FIG. 8. A conveyor 41 for temporarily holding a sheet before supplying it to a bonding position 39 is disposed in parallel with a series of main transport conveyor mechanisms comprised of conveyors 35, 36, 37 and 38. The conveyors 36 and 38 of the main transport conveyor mechanism are fixed to the table top 54. On the other hand, a plate 55 is provided for mounting the conveyor 35 as well as another conveyor 40 for transferring a sheet onto the holding conveyor 41. Both the conveyors 35 and 40 are movable along guide rods 57a of a frame 57 fixed to the table top 54, in the direction of an arrow X, namely, in the direction perpendicular to the length of the conveyors of the main transport conveyor mechanism. Similarly, another plate 56 is provided for mounting the conveyor 37 thereon along with a conveyor 42 for returning a sheet after bonding to the transport conveyor 38 of the main transport conveyor mechanism. The conveyors 42 and 37 are also adapted to slide along guide rods 58a of a frame 58 fixed to the table top 54, in the direction of an arrow Y normal to the sheet transport direction. In each of the conveyors, two endless round belts are provided between two rollers and driven by a motor so as to transport each sheet having a predetermined number of lead frames, directly supporting the sheet thereon. Alternatively, the conveyors may be formed of belts of different configurations, such as angular, flat or V-shaped, or may be formed of chains.

Figure 9:
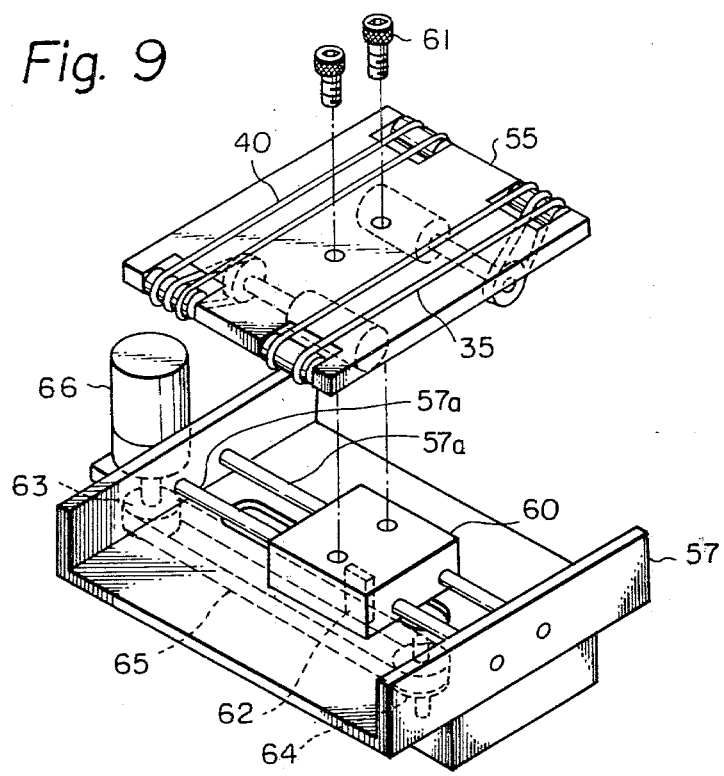
FIG. 9 is an exploded perspective view of an operating mechanism for a transfer conveyor of the conveyor mechanism arrangement illustrated in FIG. 7.

FIG. 9 illustrates a perspective view of an operating mechanism for the transport conveyor 35 and the transfer conveyor 40. The plate 55 on which the conveyors 35 and 40 are mounted is secured by screws 61 to a slider 60 which is slidable on the guide rods 57a arranged on the frame 57 at right angles with the transport direction. A bracket 62 is fixed to the lower face of the slider 60 and connected at one end to a timing belt 65 which is provided between pulleys 63 and 64. Thus, the slider 60 is adapted to be driven along the length of the guide rods 57a, upon rotation of pulley 63 by a reversible electric motor 66 drivingly connected thereto. An operating mechanism for the conveyors 37 and 42 has substantially the same structure as that of the operating mechanism for the conveyors 35 and 40 just described.

The operation of the automatic wire bonders 5a, 5b or 5c as illustrated in FIGS. 7 and 8 will now be described. Since the wire bonding operation generally takes a longer time as compared with the preceding die bonding operation, a plurality of automatic wire bonders are used with one die bonder to coordinate operating speed with the die bonder. A plurality of wire bonders are connected in continuous form in the preferred embodiment of the invention (three wire bonders 5a, 5b and 5c are employed in the embodiment illustrated in FIG. 1.). When a sheet is fed from the left in FIG. 8 (in the direction of arrow P), the sheet may be subjected to the wire bonding operation by the first of the automatic wire bonders or it may be further fed to the succeeding second automatic wire bonder without being subjected to wire bonding by the former wire bonder. Likewise, the sheet may be further fed to the third bonder without being subjected to wire bonding by the second or first wire bonders.

More specifically, when there is no sheet on the reserve conveyor 41, the conveyors 35 and 40 are moved forwardly on the table top 54 (in the direction of an arrow indicated by F of FIG. 7), and after the conveyor 40 receives a sheet thereon, it returns in the direction of an arrow indicated by R of FIG. 7 to a position as shown in FIG. 8. The fed sheet on the conveyor 40 is then transferred onto the reserve conveyor 41. The sheet thus transferred onto the reserve conveyor 41 is supplied to the bonding position 39 for bonding by the operation of the conveyor 41. If another sheet is already being subjected to the bonding operation at the bonding position 39, the sheet on the conveyor 41 is retained until the first sheet is bonded at position 39. When a sheet is being retained on the reserve conveyor 41 and yet another sheet is being supplied to the automatic wire bonder in the direction of the arrow indicated by P of FIG. 8, that sheet is later fed onto conveyor 35 and transferred from the conveyor 35 to 36, from 36 to 37 and from 37 to 38 successively, and finally transported from conveyor 38 to the succeeding automatic wire bonder. When the sheet presently at the bonding position 39 has completed wire bonding it is transferred to the returning conveyor 42. A sheet detector then operates and the conveyors 42 and 37 are moved in the direction of the arrow indicated by F of FIG. 7 to further transfer the sheet onto the conveyor 38. A series of these operations is controlled by a known electric control means provided in a separate position. The main transport conveyor mechanism is controlled so as to preferentially transport a wiring-finished sheet.

The device 6 illustrated in FIG. 2 is a magazine conveyor and encasing mechanism for receiving wiring-finished sheets from the automatic wire bonders and encasing or loading them into a known magazine (which is capable of encasing a plurality of sheets). The mechansim 6 comprises a magazine lifting mechanism and conveyors for feeding the sheets into the magazine. The structure of the magazine conveyor and encasing mechanism itself is not novel. The sheets loaded in the magazine may be carried by the operator, as in the conventional technique, to another location whereby a succeeding step can be performed on the sheets, for example, a packaging step with the sheets being subjected to a packaging operation using plastic moldings or ceramic packages. Alternatively, a suitable packaging apparatus may be connected directly to the automatic wire bonder 5c instead of employing the magazine conveyor 6 so that the moldings or packages can be automatically applied directly to the sheets after completion of the wire bonding.

As mentioned above, the fabrication and bonding system of the present invention enables the automated fabrication of semiconductor devices and including, in particular, the automated transport of the materials or intermediate products during the fabrication, thus saving labor and improving fabricating efficiency.

Figure 10:
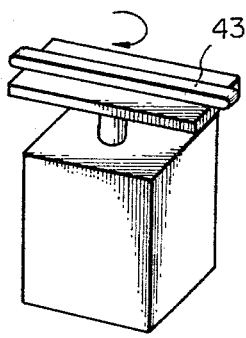
FIG. 10 is a perspective view of a conveyor for changing a transport direction which may be additionally employable in the buffer means arranged between the automatic die bonder and wire bonder of the system.

In the system in accordance with the foregoing embodiment, a conveyor 43, which is changeable in direction as illustrated in FIG. 10, may be additionally employed as buffer means. The conveyor 43 is effective especially when used in an arrangement where a plurality of systems as mentioned above are employed, enabling free sheet travelling between the systems. Employment of this additional buffer means can further improve the operating efficiencies of the automatic die bonder and the automatic wire bonder and in addition can provide a solution for possible failure or trouble with the die bonder or wire bonder in the system.

Figure 11:
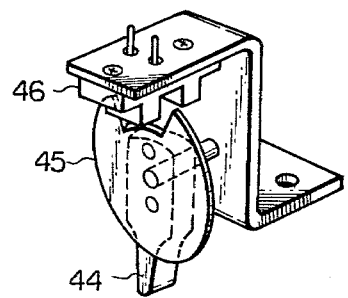
FIG. 11 is a perspective view of a sheet detector employable in the system of the present invention.

In a preferred mode of the invention, sheet detection is essential to effectively automatically operate the apparatuses as mentioned above. One embodiment of a mechanism for carrying out sheet detection is as illustrated in FIG. 11. In general, a sheet material can be detected using a photosensor. The sheets handled in the system of the present invention, however, have a plurality of apertures because they are presented in the form of lead frames and there is more difficulty in their being detected by shutting off the light. The detector mechanism illustrated in FIG. 11 has a lever 44 rotatable by a sheet being transported and a shutter 45 connected to the lever 44 for shutting off the light from a photosensor 46 when rotated by lever 44. The shutter 45 is normally kept in the non-activating position as depicted in FIG. 11 by means of a weight or spring.

What is claimed is:

1. A system for automatically fabricating and bonding semiconductor devices using lead frames and semiconductor chips, which comprises:
    (a) a single automatic die bonder including (i) bonding means for successively mounting semiconductor chips on respective lead frames supplied in a continuous strip, (ii) cutting means for cutting the continuous strip of lead frames into sheets comprised of a given number of lead frames after completion of the chip mounting, and (iii) transport means for conveying the cut sheets;
    (b) buffer means operatively connected to said die bonder for temporarily holding the cut sheets of a given number of lead frames supplied thereto from said transport means of said automatic die bonder, said buffer means including (i) means for conveying the cut sheets along a transport path, (ii) at least one magazine storage means for storing said cut sheets provided at an intermediate position along the transport path of said conveying means and having a plurality of sheet-holding racks, and (iii) operating means for positioning said sheet-holding racks of the magazine storage means to a desired position relative to the transport path of said conveying means; and
    (c) a plurality of automatic wire bonders, operatively and successively connected together with the first of said wire bonders being operatively connected to said buffer means, for selectively subjecting unprocessed sheets supplied from said buffer means or the preceding wire bonder to electrical conductor wiring processing or transporting sheets to a succeeding wire bonder, each said automatic wire bonder including (i) main transport conveyor means for conveying sheets fed from said buffer means or the preceding wire bonder along a predetermined transport path, (ii) first transfer conveyor means for selectively supplying unprocessed sheets, which have been fed to said main transport conveyor means, to a wire bonding region, (iii) wire bonding means for wire processing sheets supplied to the wire bonding region, and (iv) second transfer conveyor means for discharging the wire-processed sheets from the wire bonding region to said main transport conveyor means for subsequent transport; and
    wherein said one automatic die bonder, buffer means, and the plurality of automatic wire bonders are connected together along a continuous automated operational line for fabricating and bonding said semiconductor devices at a constant rate.

2. The system as set forth in claim 1, which further comprises detachable and transportable magazines having a plurality of sheet-holding racks and magazine conveyor and encasing means for receiving wiring-finished sheets from said main transport conveyor means of the last of the successively connected automatic wire bonders and encasing the sheets into said magazines.

3. The system as set forth in claim 1, wherein said automatic die bonder further comprises detector means for detecting changes in thickness of the continuous strip of lead frames before the operation of said bonding means and means for expelling a sheet containing the thickness change cut by said cutting means in response to the detection of the thickness change by said detector means.

4. The system as set forth in claim 3, wherein said detector means comprises a lever member adapted to rotatably pivot upon the passing thereby of a portion of the continuous strip of lead frames containing a change in thickness and a photosensor adapted to cooperate with said pivotable lever member to produce an electrical signal in response to the passing of said strip portion containing a change of thickness.

5. The system as set forth in claim 3, wherein said expelling means comprises a crank mechanism driven by a motor and an expelling member operatively connected to said crank mechanism for pivotal rotation about an axis and associated with said transport means for expelling a cut sheet located thereon when pivotally rotated.

6. The system of claim 5 further comprising control means for receiving a signal from said detector means when a thickness change is detected on the strip of lead frames and for activating said motor for driving the crank mechanism of said expelling means.

7. The system as set forth in claim 1, wherein said first transfer conveyor means includes a reserve conveyor for temporarily holding the sheet before the bonding operation, said reserve conveyor being adapted to supply the sheet into the wire bonding region when the region is empty.

8. The system as set forth in claim 7, wherein said first transfer conveyor means further includes a transfer conveyor movable between a position in the sheet transport path of said main transport conveyor means and a position for connection with said reserve conveyor, and said automatic wire bonder includes an operating mechanism for said transfer conveyor.

9. The system as set forth in claim 8, wherein the sheet-feeding path of said reserve conveyor to the wire bonding region and the sheet transport path of the main transport conveyor means are arranged in parallel with each other and said transfer conveyor is movable in a direction perpendicular to the sheet transport path of the main transport conveyor means.

10. The system of claim 7 or 8, wherein said second transfer conveyor means includes a transfer conveyor movable between a position in the sheet transport path of said main transport conveyor means and a position for connection with a wire bonding region opposite to said reserve conveyor, and said automatic wire bonder includes an operating mechanism for said second transfer conveyor.

11. The system of claim 10 wherein the sheet-receiving path from the wire bonding region to said second transfer conveyor and the sheet-transport path of said main transport conveyor means are arranged in parallel with each other and said second transfer conveyor is movable in a direction perpendicular to the sheet-transport path of said main transport conveyor means.

12. The system of claim 1, further comprising conveyor means arranged between said automatic die bonder and said automatic wire bonder, said conveyor means being changeable in direction for operatively connecting the automatic system with at least another system for fabricating and bonding semiconductor devices.

13. The system as set forth in claim 1, wherein said operating means for positioning of the magazine storage means includes a selectively actuated motor, gears driven by said motor, and a feed screw connected to said gears and engaged in a threaded hole formed in said magazine means.

14. The system as set forth in claim 1, wherein said conveying means of said buffer means includes an endless conveyor belt and a motor and pulley mechanism for driving said endless belt, said endless belt passing through said magazine storage means.

15. The system as set forth in claim 1, further comprising:
means for holding a series of lead frames preliminarily formed as a continuous strip of material; and wherein said bonding means of said die bonder successively mounts semiconductor chips on respective lead frames of the continuous strip fed from said holding means.

16. The system as set forth in claim 15, wherein said holding means comprises a reel member around which said continuous strip of lead frames is wound.

17. The system of claim 1 wherein said automatic die bonder further includes means for automatically and continuously supplying semiconductor chips to said bonding means and wherein said bonding means includes a bonding head and a sensor for controlling the bonding position of the lead frame on which a semiconductor chip is to be mounted.

* * * * *

UNITED STATES PATENT AND TRADEMARK OFFICE
CERTIFICATE OF CORRECTION

PATENT NO. : 4,301,958

DATED : Nov. 24, 1981

INVENTOR(S) : Hatakenaka et al.

It is certified that error appears in the above—identified patent and that said Letters Patent is hereby corrected as shown below:

Front page, [54] "ARRANGEMENT" should be --A SYSTEM--;
           [75] Inventors, line 2, "Tama" should be --Tokyo--;
           [56] References Cited, line 8, "Schourtes" should be --Scourtes--.
Column 1, line 2, "ARRANGEMENT" should be --A SYSTEM--;
Column 1, line 66, "operation" should be --operations--.
Column 3, line 43, after "illustrate" insert --on an enlarged scale--.
Column 4, line 23, delete "shown";
Column 4, line 24, delete "in FIG. 3";
Column 4, line 25, "and," thould be --, and--;
Column 4, line 64, "however" should be --, however,--;
Column 5, line 30, "bonders," should be --bonder--;
Column 5, line 31, "bonder," should be --bonders,--;
Column 5, line 64, after "described" insert --,--.
Column 7, line 10, "sheet is later" should be --latter sheet is--;
Column 7, line 15, after "bonding" insert --,--.
Column 10, line 3, "a" should be --the--.

Signed and Sealed this

Twenty-fifth Day of May 1982

[SEAL]

Attest:

Attesting Officer

GERALD J. MOSSINGHOFF

Commissioner of Patents and Trademarks